(12) United States Patent
Su et al.

(10) Patent No.: US 11,686,761 B1
(45) Date of Patent: Jun. 27, 2023

(54) METHOD AND NON-TRANSITORY COMPUTER-READABLE MEDIUM FOR PERFORMING MULTIPLE TESTS ON A DEVICE UNDER TEST

(71) Applicant: NANYA TECHNOLOGY CORPORATION, New Taipei (TW)

(72) Inventors: Chien-Hwa Su, New Taipei (TW); Chang-Hung Wu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/546,318

(22) Filed: Dec. 9, 2021

(51) Int. Cl.
*G01R 31/28* (2006.01)

(52) U.S. Cl.
CPC ..... *G01R 31/2834* (2013.01); *G01R 31/2851* (2013.01)

(58) Field of Classification Search
CPC .................. G01R 31/2834; G01R 31/2851

USPC ......................................................... 702/120
See application file for complete search history.

(56) References Cited

U.S. PATENT DOCUMENTS

| 4,974,184 A | * | 11/1990 | Avra | G01R 31/318385 |
| | | | | 708/252 |
| 2014/0040852 A1 | * | 2/2014 | Thong | G01R 31/30 |
| | | | | 716/136 |
| 2014/0149811 A1 | * | 5/2014 | Ross | G01R 31/2882 |
| | | | | 714/724 |
| 2020/0355738 A1 | * | 11/2020 | Sun | G01R 31/318371 |

* cited by examiner

*Primary Examiner* — John H Le
(74) *Attorney, Agent, or Firm* — Xuan Zhang

(57) ABSTRACT

A method and non-transitory computer-readable medium for performing multiple tests on a device under test (DUT) are provided. The method includes inputting a plurality of test patterns to a test apparatus, performing each of the plurality of test patterns on the DUT without interruption, and obtaining a respective result for the DUT in response to each of the plurality of test patterns.

14 Claims, 8 Drawing Sheets

600

Inputting a plurality of test patterns in a test apparatus — 601

Performing the plurality of test patterns on the DUT without interruption — 602

Obtaining a respective result for the DUT in response to each of the plurality of test patterns — 603

Generating a Shmoo plot based on all the respective results — 604

METHOD AND NON-TRANSITORY COMPUTER-READABLE MEDIUM FOR PERFORMING MULTIPLE TESTS ON A DEVICE UNDER TEST

TECHNICAL FIELD

The present disclosure relates to a method and non-transitory computer-readable medium for performing multiple tests on a device under test (DUT).

DISCUSSION OF THE BACKGROUND

After the manufacture of a semiconductor device, integrated device, or electronic component is completed, analysis or tests can be conducted to verify the functions thereof. The analysis is intended to determine the performance of the semiconductor device under various test patterns/conditions (for example, voltages, currents, data rate, and temperature). For example, the analysis can be used to determine the limits that the semiconductor device can bear under various input signals.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a method for performing multiple tests on a device under test (DUT). The method includes inputting a plurality of test patterns in a test apparatus, performing each of the plurality of test patterns on the DUT without interruption, and obtaining a respective result for the DUT in response to each of the plurality of test patterns.

Another aspect of the present disclosure provides an apparatus for performing multiple tests on a DUT. The apparatus includes at least one non-transitory computer-readable medium having stored thereon computer-executable instructions and at least one processor coupled to the at least one non-transitory computer-readable medium, wherein the computer-executable instructions are executable by the at least one processor and cause the apparatus to input a plurality of test patterns in a test apparatus; perform each of the plurality of test patterns on the DUT without interruption; and obtain a respective result for the DUT in response to each of the plurality of test patterns.

Another aspect of the present disclosure provides a non-transitory computer-readable medium, which stores computer-executable instructions executed on a computer system for performing a method for automatically performing multiple tests on a DUT, wherein the method includes inputting a plurality of test patterns in a test apparatus, performing each of the plurality of test patterns on the DUT without interruption, and obtaining a respective result for the DUT in response to each of the plurality of test patterns.

The subject disclosure provides a method for performing multiple test patterns/conditions on a DUT. Two or more test patterns can be input at the same time and performed automatically and sequentially on the DUT. In other words, the two or more test patterns can be performed on the DUT without interruption. In addition, without the need to repeatedly input the test patterns, setting time for the test can be reduced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It can also be appreciated by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
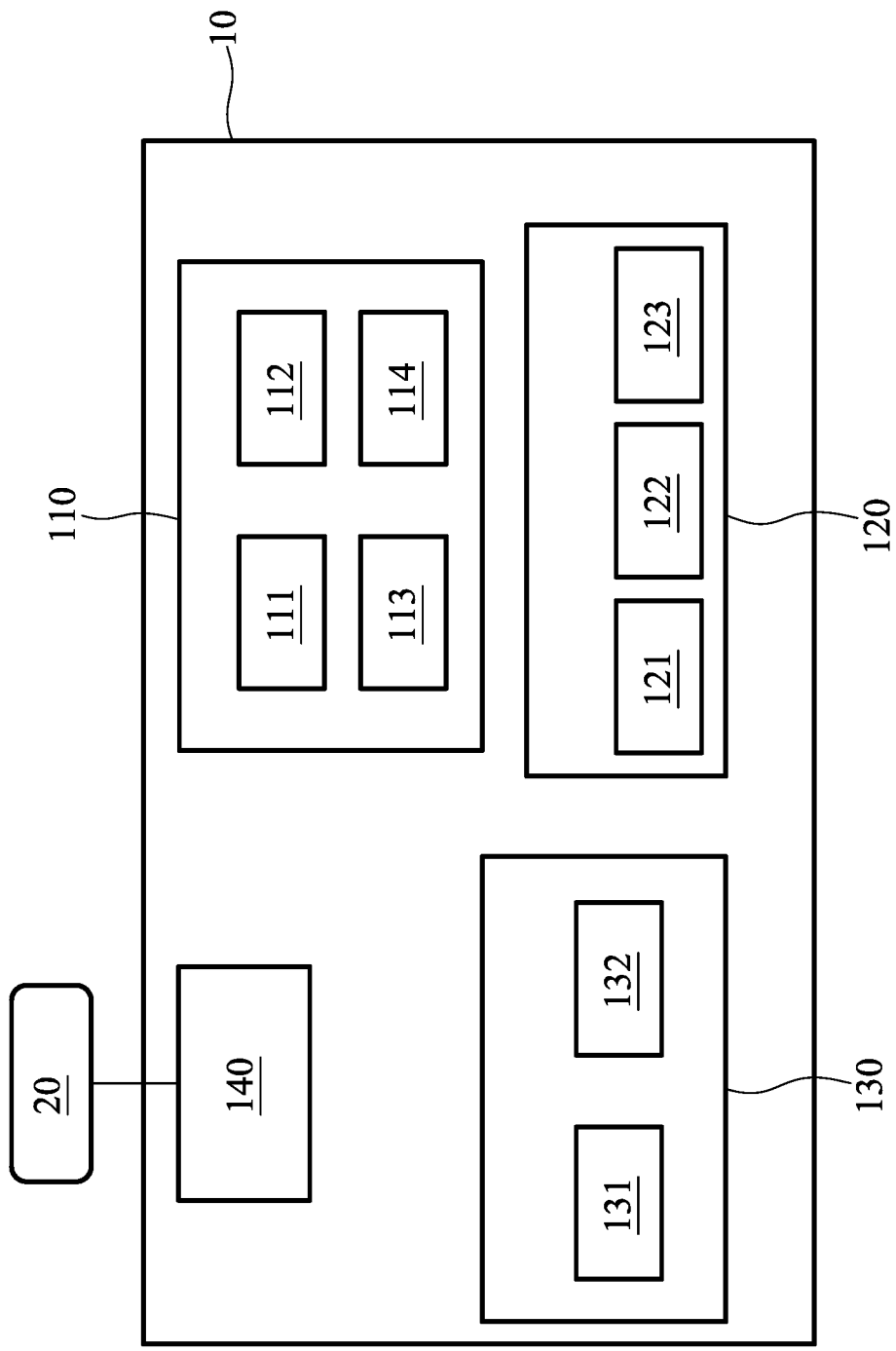
FIG. 1 is a schematic diagram of an apparatus for testing semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled to" another element, the initial element may be directly connected to, or coupled to, another element, or to other intervening elements.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

Shmoo test is one of the tests that can be used in the analysis or the automatic test equipment (ATE) for semiconductor devices. Shmoo test includes a visual representation of a series of results of a semiconductor device (e.g., Shmoo plot). In the Shmoo test, each respective result performed on the semiconductor device can result in a pass-fail or in a numerical result (for example, failure counts or bit error rate). In present practice, each test pattern/condition is input and performed sequentially. Therefore, the generation of a Shmoo plot is time-consuming.

FIG. 1 is a schematic diagram of an apparatus for testing a semiconductor device, in accordance with some embodiments of the present disclosure. The apparatus 10 can be used in the failure analysis of a semiconductor device, an integrated device, or an electronic component. In some embodiments, the apparatus 10 can be used in the automatic test of a semiconductor device. In some embodiments, the apparatus 10 may be or may include automatic test equipment (ATE) (for example. Advantest Memory Tester). The apparatus 10 can be configured to perform a test on a device under test (DUT) 20.

Referring to FIG. 1, the apparatus 10 may include a testing device 110, a controlling device 120, a computing device 130, and a load board 140. In some embodiments, the testing device 110, the controlling device 120, the computing device 130, and the load board 140 are electrically connected to each other. For example, the testing device 110 can be electrically connected to the controlling device 120. The testing device can be electrically connected to the load board 140. The controlling device 120 can be electrically connected to the computing device 130.

The testing device 110 includes one or more modules for testing semiconductor device, integrated device, and electronic components. As shown in FIG. 1, the testing device 110 includes a direct current (DC) module 111, a digital module 112, a precision measurement unit (PMU) 113, and a relay board 114. The controlling device 120 may transmit instructions or commands to corresponding modules of the testing device 110 based on the types/contents of the instructions/commands.

The DC module 111 can be used for testing DC parameters of a semiconductor device, integrated device, or electronic component. In one embodiment, the DC module 111 may provide DC currents to the semiconductor device, integrated device, or electronic component under test. In another embodiment, the DC module 111 may provide voltage to the semiconductor device, integrated device, or electronic component under test.

The digital module 112 can be used for testing functions of a semiconductor device, integrated device, or electronic component. In some embodiments, the digital module 112 can be used to provide various signals to a DUT 20. In some embodiments, the digital module 112 can be used in providing baseband signals or radio frequency signals to the DUT 20.

In some embodiments, the digital module 112 can provide signals having different switching frequencies to the DUT 20. In some embodiments, the digital module 112 can control the rising/falling edges of the signals to be provided to the DUT 20. In some embodiments, the digital module 112 can provide synchronous or non-synchronous signals to the DUT 20.

The PMU 113 can be used for testing DC parameters of a semiconductor device, integrated device, or electronic component. The PMU 113 can provide DC parameters that have high accuracy. In some embodiments, the PMU 113 may provide DC parameters that have a small magnitude. In some embodiments, the PMU 113 may provide an accurate DC current of a low value. In some embodiments, the PMU 113 can provide an accurate voltage of a small magnitude.

The relay board 114 can provide electrical routings to the testing device 110. In some embodiments, if the number of the conductive contacts (pins) of the DUT 20 exceeds the number of testing channels that can be provided by the testing device 110, some of the pins may be connected to the same channel through the relay board 114. The relay board 114 can be used to connect different pins to a specific testing channel of the testing device 110.

The controlling device 120 includes a processor 121, a memory 122 and one or more input/out (I/O) ports 123.

The processor 121 may include but is not limited to, for example, a microprocessor, a central processing unit (CPU), an application-specific instruction set processor (ASIP), a machine control unit (MCU), a graphics processing unit (GPU), a physics processing unit (PPU), a digital signal processor (DSP), an image processor, a coprocessor, a storage controller, a floating-point unit, a network processor, a multi-core processor, a front-end processor or the like.

The memory 122 may be non-transitory computer-readable memory having stored thereon computer-executable instructions. In some embodiments, the memory 122 may include but is not limited to a random-access memory (RAM) such as a static RANI (SRAM) or a dynamic RAM (DRAM). In some embodiments, the memory 122 may include a read-only memory (ROM). The memory 122 may include a cache (not shown) for storing data that have recently been accessed, so that future requests for that data can be served faster. The data stored in the cache may include the result of an earlier computation of the processor 121. The data stored in the cache may include a copy of data stored in the memory 122.

In some embodiments, the processor 121 can be electrically connected to the memory 122. The processor 121 can be electrically connected to the I/O ports 123. The memory 122 can be electrically connected to the I/O ports 123.

The controlling device 120 may receive testing data from the computing device 130. The controlling device 120 may generate instructions and commands based on the testing data received from the computing device 130. The instructions and commands generated by the controlling device 120 can be stored in the memory 122. The testing instructions/commands generated by the controlling device 120 can be transmitted to the testing device 110 through the I/O ports 123.

The I/O ports 123 can be any computer ports that are capable of sending and receiving data. The I/O port 18 may include but is not limited to a Universal Serial Bus (USB) port, a IEEE 1394 port (also known as FireWire port), a PS/2 port (also referred to as Mini-DIN ports), a serial port (also known as RS-232 or communication (COM) port), a parallel port (also known as the Line Printer (LPT) port), a Small Computer Systems Interface (SCSI) port, a ⅛-inch audio mini-jack, a RG-6 coaxial ports, or a Musical Instrument Digital Interface (MIDI) ports.

The computing device 130 includes a processor 131 and a memory 132.

The processor 131 may include but is not limited to, for example, a microprocessor, a central processing unit (CPU), an application-specific instruction set processor (ASIP), a machine control unit (MCU), a graphics processing unit (GPU), a physics processing unit (PPU), a digital signal processor (DSP), an image processor, a coprocessor, a storage controller, a floating-point unit, a network processor, a multi-core processor, a front-end processor or the like. The processor 131 can be electrically connected to the memory 132.

The memory 132 may be non-transitory computer-readable memory having stored thereon computer-executable instructions. The memory 132 may include but is not limited to a random-access memory (RAM) such as a static RAM (SRAM) or a dynamic RANI (DRAM). In some embodiments, the memory 132 may include a read-only memory (ROM). The memory 132 may include a cache (not shown) for storing data that have recently been accessed, so that future requests for that data can be served faster. The data stored in the cache may include the result of an earlier computation of the processor 131. The data stored in the cache may include a copy of data stored in the memory 132.

A device under test (DUT) 20 can be mounted on the load board 140. One or more conductive connections or physical connections exist between the DUT 20 and the load board 140. In some embodiments, the DUT 20 can be a semiconductor device, an integrated circuit or an electronic component. In some embodiments, the DUT 20 can be a memory device.

Figure 2:
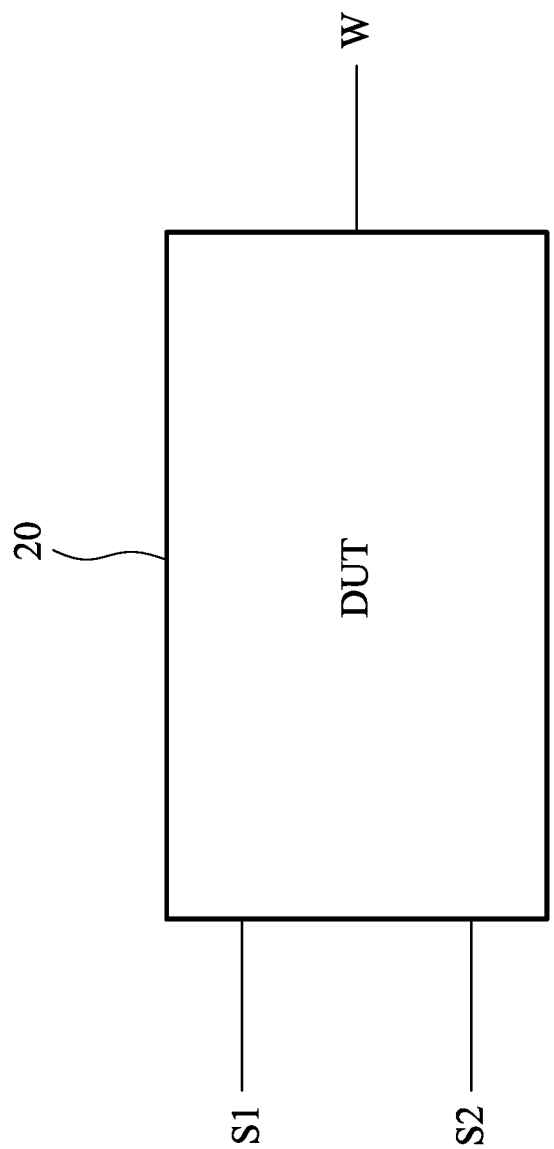
FIG. 2 is a perspective view of a device under test (DUT), in accordance with some embodiments of the present disclosure.

FIG. 2 is a perspective view of a device under test (DUT) 20, in accordance with some embodiments of the present disclosure. Referring to FIG. 2, the DUT 20 includes three terminals (or pins). In some embodiments, the DUT 20 may include more terminals or less terminals. During the analysis or the automatic test, one or more test signals/commands can be provided to the DUT 20. In some embodiments, a signal S1 is transmitted to the DUT 20 and a signal S2 is transmitted to the DUT 20. In response to the signal S1 and the signal S2, the DUT 20 can generate an output signal (or feedback signal) W.

In some embodiments, the signal S1 and the signal S2 may be provided to different terminals of the DUT 20. In some embodiments, the signal S1 and the signal S2 may be provided to the same terminal of the DUT 20. In some embodiments, the output signal W can be a function of the signal S1 and the signal S2.

In some embodiments, the signal S1 and signal S2 can include at least one of a voltage signal, a current signal, a data rate, and a temperature. In some embodiments, the signal S1 and the signal S2 can include the same attribute (for example, both signals S1 and S2 are voltage signals). In some embodiments, the signal S1 and the signal S2 can include different attributes. For example, the signal S1 can be the data rate (timing signal) and the signal S2 can be the voltage signal.

In one embodiment, the signal S1 and the signal S2 can be provided to the DUT 20 simultaneously. For example, the signal S1and the signal S2 can be provided to the DUT 20 at the same time. In some embodiments, the signal S1 and the signal S2 may be provided to the DUT 20 sequentially. In some embodiments, the signal S1 and the signal S2 can be provided to the DUT 20 at different timings.

Figure 3A:
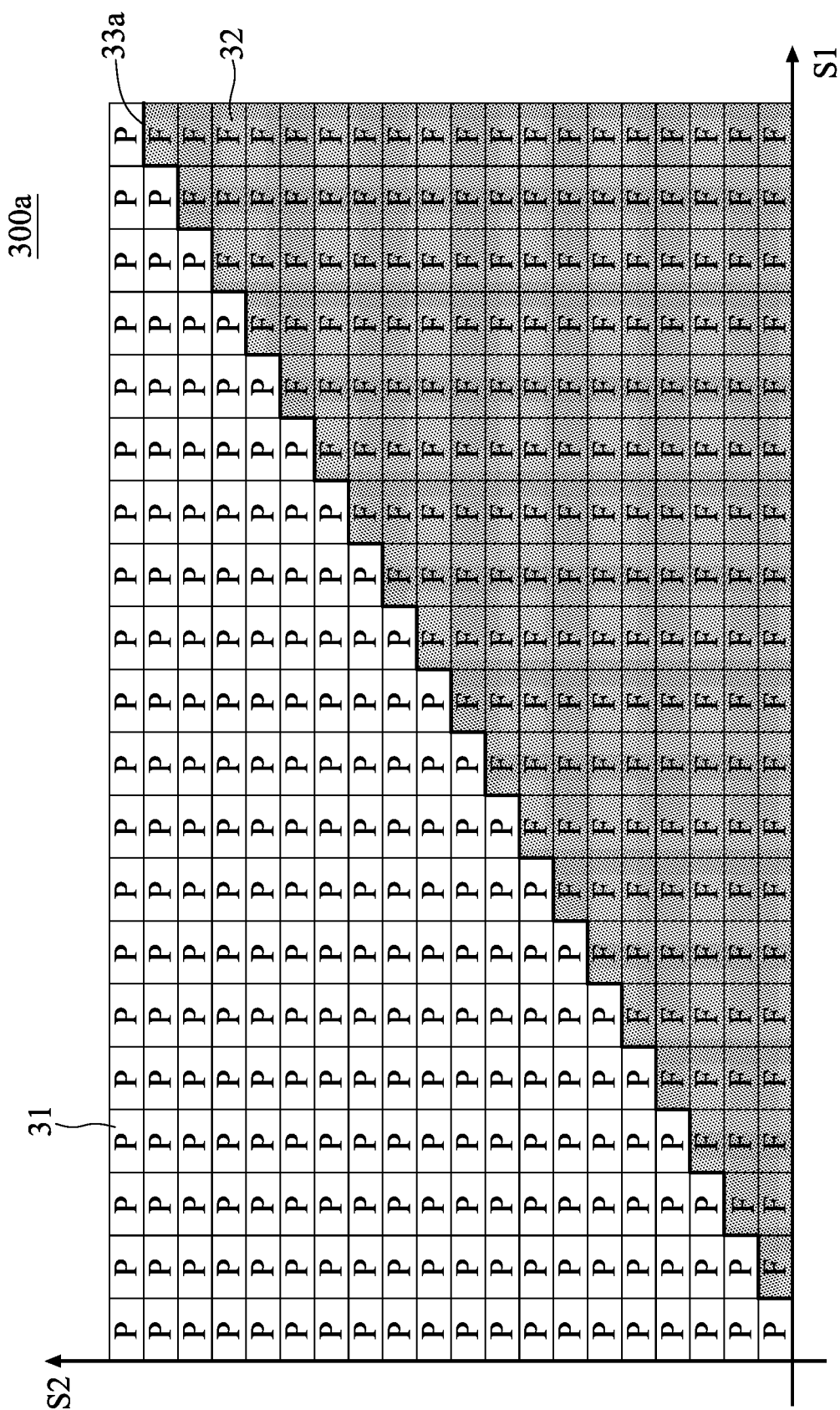
FIG. 3A is a visual representation of a series of test results of a DUT, in accordance with some embodiments of the present disclosure.

FIG. 3A is a visual representation of a series of test results of a DUT, in accordance with some embodiments of the present disclosure. Referring to FIG. 3A, the visual representation 300a includes a series of test results of the DUT 20 shown in the form of two-dimensional plots. In some embodiments, the visual representation 300a may be called a "Shmoo plot." Referring to FIG. 3A, the visual representation 300a is provided over a horizontal coordinate and a vertical coordinate. The horizontal coordinate may represent the signal S1 provided to the DUT 20. The vertical coordinate may represent the signal S2 provided to the DUT 20.

Referring to FIG. 3A, a test result 31 is obtained by providing the signal S1 having a value 31_s1 and the signal S2 having a value 31_s2 to the DUT 20. A test result 32 is obtained by providing the signal S1 having a value 32_s1 and the signal S2 having a value 32_s2 to the DUT 20.

As shown in FIG. 3A, the test result 31 labeled as "P" indicates that the output signal W complies with or fulfills a specific criterion for the DUT 20, wherein the output signal W is generated by the DUT 20 in response to the signal S1 with the value 31_s1 and the signal S2 with the value 31_s2. That is, the DUT 20 can operate under the test pattern/condition that includes the signal S1 with the value 31_s1 and the signal S2 with the value 31_s2.

The test result 32 in FIG. 3A labeled as "F" indicates that the output signal W fails to comply with or fails to fulfill a specific criterion for the DUT 20, wherein the output signal W is generated by the DUT 20 in response to the signal S1 with the value 32_s1 and the signal S2 with the value 32_s2. That is, the DUT 20 may not operate normally under this test pattern/condition that includes the signal S1with the value 32_s1 and the signal S2 with the value 32_s2.

The visual representation 300a is produced over parameter ranges. Referring to FIG. 3A, the visual representation 300a is produced by providing a range of the signal S1 and a range of the signal S2 to the DUT 20. For example, the signal S1 may be data rate including multiple frequencies. In some embodiments, the signal S2 may be the voltage signal in a range of voltage values (Volts). It can be contemplated that the signal S1 and the signal S2 can be parameters other than voltage, current, data rate, and temperature.

In the embodiment shown in FIG. 3A, twenty different values of the signal S1 are provided to the DUT 20 during the test. Also, twenty different values of the signal S2 are provided to the DUT 20 during the test. Combinations of these different values of the signals S1 and S2 results in four hundred test results of the DUT 20.

Referring to FIG. 3A, a virtual edge 33a exists between the region in which all test results are "P" and that in which all the test results are "F." The operating regions of the DUT 20 under parameter variations (for example, voltages, currents and timings) can be determined after the virtual edge 33a is obtained. As shown in FIG. 3A, the virtual edge 33a is along an axis from top right to bottom left. The virtual edge 33a can be obtained after the four hundred tests in FIG. 3A are completed.

With numerous tests to be performed, the input time of each test pattern/condition, including the signal S1 and the signal S2, will increase significantly. To improve testing efficiency, all test patterns can be input at once, and performed on the DUT 20 automatically. Therefore, the time required to generate a Shmoo plot for a single DUT 20 can be reduced.

Figure 3B:
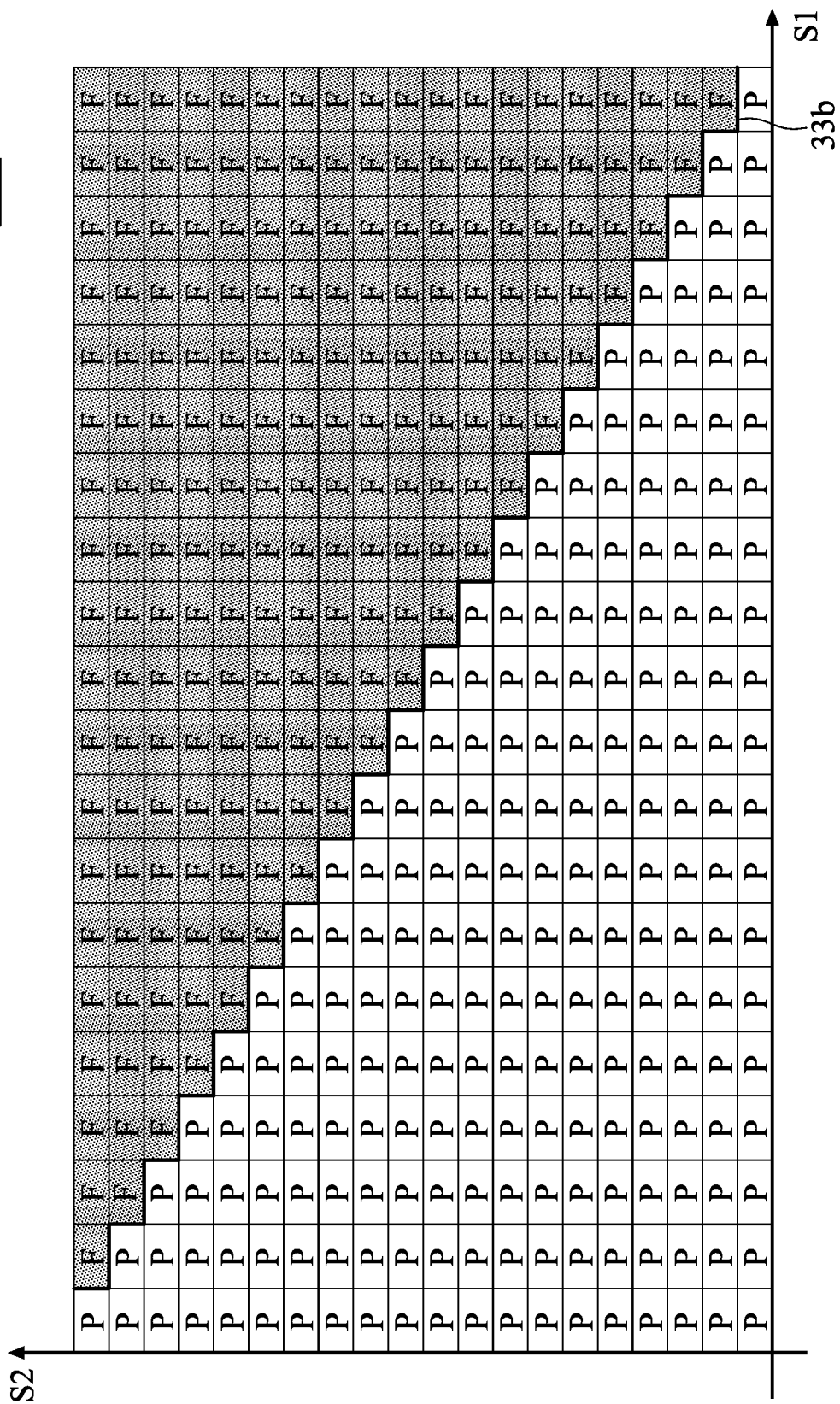
FIG. 3B is a visual representation of a series of test results of a DUT, in accordance with some embodiments of the present disclosure.

FIG. 3B is a visual representation of a series of test results of a DUT, in accordance with some embodiments of the present disclosure. The visual representation 300b in FIG. 3B is similar to the visual representation 300a in FIG. 3A, differing in that in FIG. 3B, the virtual edge 33b is along an axis from top left to bottom right.

The different visual representation 300b may result in different types of DUT 20. In some embodiments, the different visual representation 300b may result in different types of signal performed on the DUT 20. In some embodiments, the different visual representation 300b may result in differences in range of the signal S1 and the signal S2.

The operating regions of the DUT 20 under parameter variations can be determined after the virtual edge 33b is obtained. As shown in FIG. 3B, the virtual edge 33b can be obtained after four hundred tests are completed.

Figure 3C:
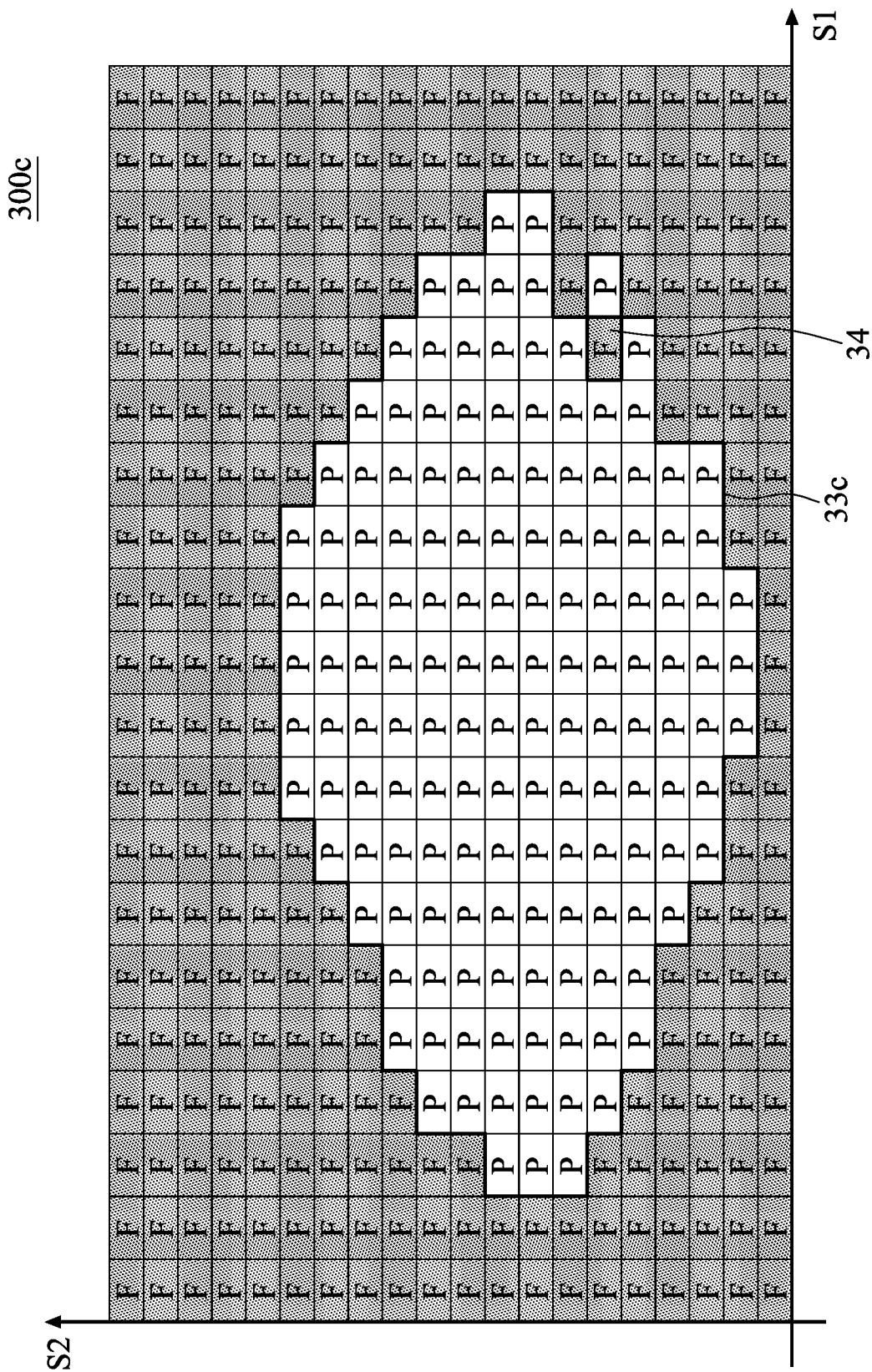
FIG. 3C is a visual representation of a series of test results of a DUT, in accordance with some embodiments of the present disclosure.

FIG. 3C is a visual representation of a series of test results of a DUT, in accordance with some embodiments of the present disclosure. The visual representation 300c in FIG. 3C is similar to the visual representation 300a in FIG. 3A, differing in that in FIG. 3C, the virtual edge 33c is not in a linear direction.

As shown in FIG. 3C, the test result 34 representing "F" may be surrounded by test results "P." In some embodiments, the different visual representation 300c may result in different types of DUT 20. In some embodiments, the different visual representation 300c may result in different types of signal performed on the DUT 20. In some embodiments, the different visual representation 300c may result in differences in range of the signal S1 and the signal S2.

The operating regions of the DUT 20 under parameter variations can be determined after the virtual edge 33c is obtained. As shown in FIG. 3C, the virtual edge 33c can be obtained after the four hundred tests are completed.

Figure 4:
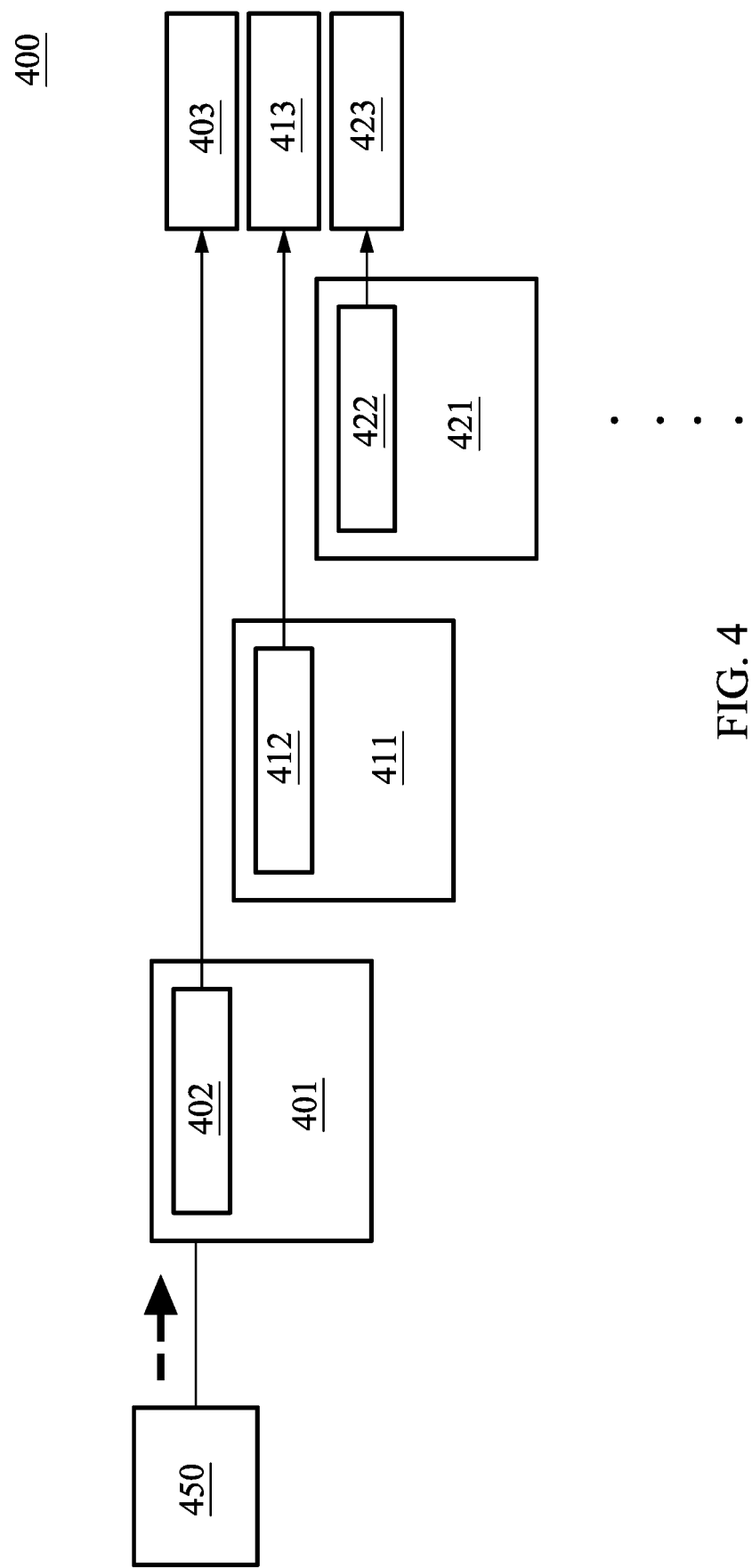
FIG. 4 is a schematic diagram of a method for testing semiconductor device, in accordance with some embodiments of the present disclosure.

FIG. 4 is a schematic diagram of a system 400 for testing semiconductor device, in accordance with some embodiments of the present disclosure. The system 400 includes a terminal 450, registers 401, 411, 421, test patterns (or test conditions) 402, 412, 422, and results 403, 413, 423.

Referring to FIG. 4, the system 400 has a terminal 450 receiving data. In some embodiments, the data includes one or more test patterns/conditions. In some embodiments, the data may be stored in a memory (not shown in FIG. 4). The data stored in the memory can be transmitted to the registers 401, 411, and 421. The number of registers is not limited. That is, the system 400 may include one or more registers. As shown in FIG. 4, the input data received from the terminal 450 can be transmitted to registers 401, 411, and 421. In some embodiments, each register can store at least one test pattern. For example, the register 401 can store a test pattern 402. The register 411 can store a test pattern 412. The register 421 can store a test pattern 422. In some embodiments, the number of test patterns is not limited. That is, each register can store one or more test patterns.

The test patterns 402, 412, and 422 can be performed on a DUT. For example, the test patterns 402, 412, and 422 can be performed on the DUT 20 in FIG. 2. Each test pattern 402, 412, and 422 may include a signal S1 and a signal S2. In some embodiments, the test patterns 402, 412, and 422 may include the same signal S1 and the same signal S2. In some embodiments, the test patterns 402, 412, and 422 may include different signal S1 and different signal S2. In some embodiments, the test patterns 402, 412, and 422 may include the same signal S1 and different signal S2. The test patterns 402, 412, and 422 may include different signal S1 and the same signal S2.

In some embodiments, the test patterns 402 can include a signal S1 having a value identical to that of the signal S1 of test pattern 412. The test pattern 402 can include a signal S1 having a value different from that of the signal S1 of test pattern 412. Similarly, the test pattern 402 can include a signal S2 having a value identical to that of the signal S2 of test pattern 412. The test pattern 402 can include a signal S2 having a value different from that of the signal S2 of test pattern 412.

In some embodiments, the test patterns 402 can include a signal S1 having a value identical to that of the signal S1 of test pattern 422. The test pattern 402 can include a signal S1 having a value different from that of the signal S1 of test pattern 422. Similarly, the test pattern 402 can include a signal S2 having a value identical to that of the signal S2 of test pattern 422. The test pattern 402 can include a signal S2 having a value different from that of the signal S2 of test pattern 422.

In some embodiments, the test patterns 412 can include a signal S1 having a value identical to that of the signal S1 of test pattern 422. The test pattern 412 can include a signal S1 having a value different from that of the signal S1 of test pattern 422. Similarly, the test pattern 412 can include a signal S2 having a value identical to that of the signal S2 of test pattern 422. The test pattern 412 can include a signal S2 having a value different from that of the signal S2 of test pattern 422.

In response to the test pattern 402 applied to the DUT, a result 403 can be obtained for the DUT. In response to the test pattern 412 applied to the DUT, a result 413 can be obtained for the DUT. In response to the test pattern 422 applied to the DUT, a result 423 can be obtained for the DUT. The results 403, 413, and 423 can be a pass-fail or in a numerical result. In some embodiments, each results 403, 413, and 423 can be a visual representation. After all results are obtained, an overall visual representation (such as the visual representations in FIGS. 3A, 3B, and 3C) may be generated based on all results. In some embodiments, the overall visual representation may be a Shmoo plot.

In some embodiments, the test patterns 402, 412, and 422 can be performed on the DUT automatically. That is, the test patterns 402, 412, and 422 can be performed on the DUT without interruption. The results 403, 413, and 423 can then be obtained sequentially. Without the need to repeatedly input the test patterns 402, 412, and 422, setting time for the test can be reduced.

Figure 5:
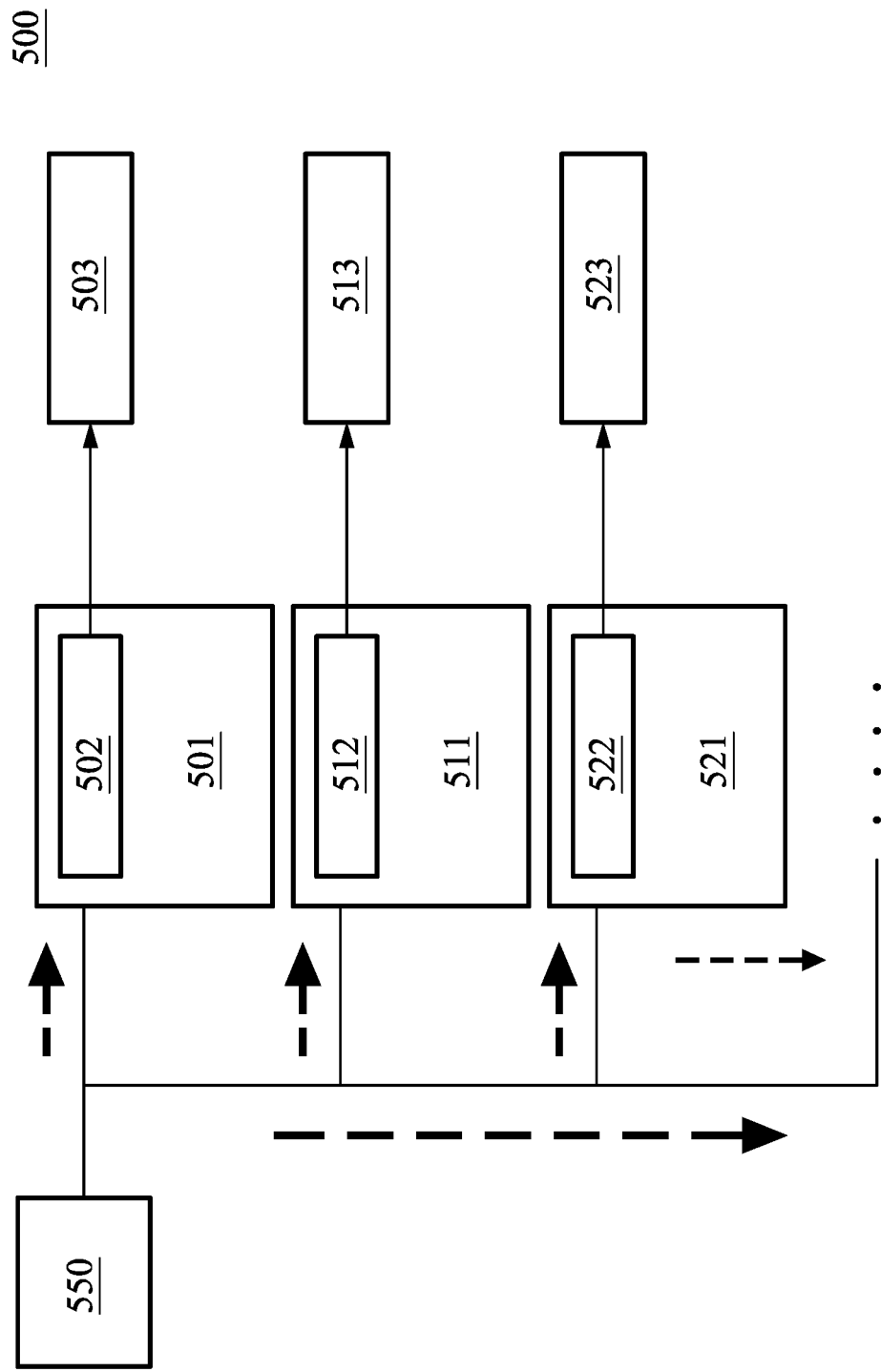
FIG. 5 is a schematic diagram of a method for testing semiconductor device, in accordance with some comparative embodiments of the present disclosure.

FIG. 5 is a schematic diagram of a system for testing semiconductor devices, in accordance with some comparative embodiments of the present disclosure. The system 500 includes a terminal 550, registers 501, 511, 521, test patterns (or test conditions) 502, 512, 522, and results 503, 513, 523.

Referring to FIG. 5, the system 500 has a terminal 550 receiving data. In some embodiments, the data includes one or more test patterns/conditions. In some embodiments, the data may be input to the registers 501, 511, and 521. The number of the registers in the system 500 is not limited. That is, the system 500 may include one or more registers. As shown in FIG. 5, the data input from the terminal 550 can be transmitted to registers 501, 511, and 521. In some embodiments, each register can store at least one test pattern. For exampled, each register can store at least one test pattern. In some embodiments, the register 501 can store a test pattern 502. The register 511 can store a test pattern 512. The register 521 can store a test pattern 522.

The test patterns 502, 512, and 522 can be performed on a DUT. For example, the test patterns 502, 512, and 522 can be performed on the DUT 20 in FIG. 2 sequentially. Each test pattern 502, 512, and 522 may include a signal S1 and a signal S2. In some embodiments, the test patterns 502, 512, and 522 may include the same signal S1 and the same signal S2. In some embodiments, the test patterns 502, 512, and 522 may include different signal S1 and different signal S2. In some embodiments, the test patterns 502, 512, and 522 may include the same signal S1 and different signal S2. The test patterns 502, 512, and 522 may include different signal S1 and the same signal S2.

In some embodiments, the test patterns 502 can include a signal S1 having a value identical to that of the signal S1 of test pattern 512. The test pattern 502 can include a signal S1 having a value different from that of the signal S1 of test pattern 512. Similarly, the test pattern 502 can include a signal S2 having a value identical to that of the signal S2 of test pattern 512. The test pattern 502 can include a signal S2 having a value different from that of the signal S2 of test pattern 512.

In some embodiments, the test patterns 502 can include a signal S1 having a value identical to that of the signal S1 of test pattern 522. The test pattern 502 can include a signal S1 having a value different from that of the signal S1 of test pattern 522. Similarly, the test pattern 502 can include a signal S2 having a value identical to that of the signal S2 of test pattern 522. The test pattern 502 can include a signal S2 having a value different from that of the signal S2 of test pattern 522.

In some embodiments, the test patterns 512 can include a signal S1 having a value identical to that of the signal S1 of test pattern 522. The test pattern 512 can include a signal S1 having a value different from that of the signal S1 of test pattern 522. Similarly, the test pattern 512 can include a signal S2 having a value identical to that of the signal S2 of test pattern 522. The test pattern 512 can include a signal S2 having a value different from that of the signal S2 of test pattern 522.

In response to the test pattern 502 applied to the DUT, a result 503 can be obtained for the DUT. In response to the test pattern 512 applied to the DUT, a result 513 can be obtained for the DUT. In response to the test pattern 522 applied to the DUT, a result 523 can be obtained for the DUT. The results 503, 513, and 523 can be a pass-fail or in a numerical result. In some embodiments, each result 503, 513, and 523 can be a visual representation. After all results are obtained, an overall visual representation (such as the visual representations in FIGS. 3A, 3B, and 3C) may be generated based on all results. In some embodiments, the overall visual representation may be a Shmoo plot.

Referring to FIG. 5, in response to the test pattern 502 stored in the register 501 applied to the DUT, the result 503 can be obtained. After the test pattern 502 is performed on the DUT, the test pattern 512 will then be input to the register 511. In response to the test pattern 512 stored in the register 511 being applied to the DUT, the result 513 can be obtained. After the test pattern 512 is performed on the DUT, the test pattern 523 will then be input to the register 521. In response to the test pattern 522 stored in the register 521 being applied to the DUT, the result 523 can be obtained.

In some embodiments, the test patterns 502, 512, and 522 can be input to the corresponding register by sequence. The results 503, 513, and 523 can then be obtained sequentially. The test patterns 502, 512, and 522 can only be input after the previous test pattern has been completed. For example, the test pattern 512 can be input after the test pattern 502 has been completed. Similarly, the test pattern 522 can be input after the test pattern 512 has been completed. The test patterns 502, 512, and 522 are repeatedly input. Therefore, the system 500 will take more setting time. Compared to the system 500 in FIG. 5, the system 400 in FIG. 4 can perform the test patterns 402, 412, and 422 on the DUT automatically without interruption. Accordingly, setting time for the test can be reduced according to the system 400, without the need to repeatedly input the test patterns.

Figure 6:
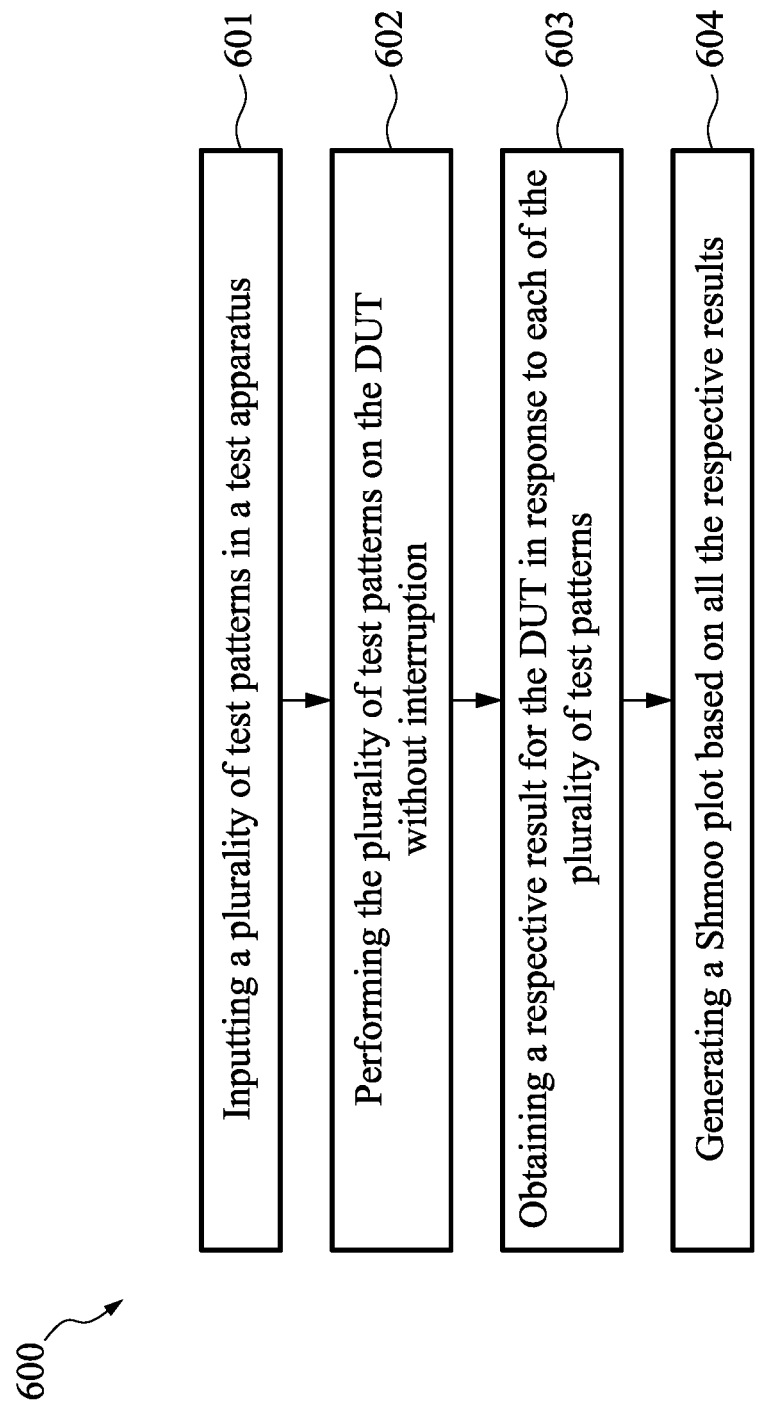
FIG. 6 is a flowchart of a method for performing multiple tests on a DUT, in accordance with some embodiments of the present disclosure.

FIG. 6 is a flowchart of a method 600 for performing multiple tests on a DUT, in accordance with some embodiments of the present disclosure. The method 600 includes operations 601, 602, 603, and 604. The method 600 can be operated by the apparatus 10 as shown in FIG. 1.

In operation 601, one or more test patterns can be input to a test apparatus. In some embodiments, the one or more test patterns are all input simultaneously. As shown in FIG. 4, the one or more test patterns 402, 411, and 412 may be input at the terminal 450 simultaneously. In some embodiments, each of the test patterns may include two signals (such as the signal S1 and the signal S2 in FIG. 2). The test patterns can include at least one of a voltage, a current, a data rate, and a temperature. In some embodiments, the test apparatus may be the ATE. In some embodiments, the test apparatus can include one or more registers to store the test patterns. That is, each of the test patterns is stored in a respective register. For example, the test pattern 402 is stored in the register 401. The test pattern 412 is stored in the register 411. The test pattern 422 is stored in the register 421.

Before the test patterns are input to the apparatus, the apparatus must be set up to receive them. For example, environmental data, such as the type or range of the test patterns, needs to be registered with the apparatus.

In operation 602, each of the test patterns is performed on a DUT automatically. In some embodiments, each of the test patterns is performed on the DUT (such as the DUT 20 as shown in FIG. 2) in sequence automatically. In other words, the test patterns are performed on the DUT without interruption. In present practice, the test patterns can only be input after the previous test pattern has been completed. Comparatively, the subject disclosure requires no repeated input of test patterns, thereby reducing setting time for the test.

In operation 603, in response to each of the test patterns, a respective result for the DUT can be obtained. The respective result can be a pass-fail or in a numerical result. In some embodiments, the respective result can be a visual representation. In some embodiments, each of the test patterns includes two signals (such as the signal S1 and the signal S2 in FIG. 2), and thus the DUT will generate a respective result in response to the signals included in each of the test patterns. Referring back to FIG. 4, in response to the test pattern 402 applied to the DUT, a result 403 can be obtained for the DUT. In response to the test pattern 412 applied to the DUT, a result 413 can be obtained for the DUT. In response to the test pattern 422 applied to the DUT, a result 423 can be obtained for the DUT.

In operation 604, a Shmoo plot can be generated based on all respective results. After all results are obtained, an overall visual representation (such as the visual representations in FIGS. 3A, 3B, and 3C) may be generated based on all results. In some embodiments, the overall visual representation may be a Shmoo plot. In some embodiments, the Shmoo plot is a 2-dimensional plot. The operating regions of the DUT under parameter variations can be determined according to the Shmoo plot.

One aspect of the present disclosure provides a method for performing multiple tests on a device under test (DUT). The method includes: inputting a plurality of test patterns in a test apparatus, performing each of the plurality of test patterns on the DUT without interruption, and obtaining a respective result for the DUT in response to each of the plurality of test patterns.

Another aspect of the present disclosure provides an apparatus for performing multiple tests on a DUT. The apparatus includes at least one non-transitory computer-readable medium having stored thereon computer-executable instructions and at least one processor coupled to the at least one non-transitory computer-readable medium, wherein the computer-executable instructions are executable by the at least one processor and cause the apparatus to: input a plurality of test patterns in a test apparatus; perform each of the plurality of test patterns on the DUT without interruption; and obtain a respective result for the DUT in response to each of the plurality of test patterns.

Another aspect of the present disclosure provides a non-transitory computer-readable medium, which stores computer-executable instructions executed on a computer system for performing a method for automatically performing multiple tests on a DUT wherein the method includes: inputting a plurality of test patterns in a test apparatus, performing each of the plurality of test patterns on the DUT without interruption, and obtaining a respective result for the DUT in response to each of the plurality of test patterns.

The subject disclosure provides a method for performing multiple test patterns/conditions on a DUT. Two or more test patterns can be input at the same time and performed automatically and sequentially on the DUT. In other words, the two or more test patterns can be performed on the DUT without interruption. In addition, without inputting the test patterns again and again, the setting time of the test can be reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for performing multiple tests on a device under test (DUT), comprising:
   inputting a plurality of test patterns in a test apparatus, wherein each of the plurality of test patterns has at least two signals input into the test apparatus, wherein each of the signals has an attribute selected from a group consisting of voltage, current, data rate, and temperature;
   storing each of the plurality of test patterns in a respective register, wherein each of the registers stores two or more signals of each of the plurality of test patterns;
   automatically performing the plurality of test patterns stored in the registers on the DUT without interruption, wherein the test patterns stored in the registers are performed on the DUT independently with each other;
   obtaining a respective result for the DUT in response to the signals of each of the plurality of test patterns stored in the respective register, such that the results are obtained correspondingly in order to determine whether the DUT is operable or not;
   generating a Shmoo plot based on all the respective results to obtain a virtual edge; and
   determine operating regions of the DUT after the virtual edge is obtained.

2. The method of claim 1, wherein the respective result is a visual representation, wherein the first signal of the first test pattern stored in the first register has a value identical to the first signal of the second test pattern store in the second register, while the second signal of the first test pattern stored in the first register has a value different from the second signal of the second test pattern store in the second register.

3. The method of claim 1, wherein the signals of each of the plurality of test patterns have the same attribute, wherein the first signal of the first test pattern stored in the first register has a value different from the first signal of the second test pattern store in the second register, while the second signal of the first test pattern stored in the first register has a value different from the second signal of the second test pattern store in the second register.

4. The method of claim 1, wherein the Shmoo plot is a 2-dimensional plot, wherein the virtual edge is in a non-linear direction.

5. The method of claim 1, wherein the test apparatus is an automatic test equipment (ATE).

6. The method of claim 1, wherein the signals of each of the plurality of test patterns have different attributes, wherein the first signal of the first test pattern stored in the first register has a value different from the first signal of the second test pattern store in the second register, while the second signal of the first test pattern stored in the first register has a value different from the second signal of the second test pattern store in the second register.

7. The method of claim 1, further comprising:
   connecting the registers to a terminal of a system; and
   inputting the signals of the test patterns to the terminal in order to store the test patterns in the register.

8. A non-transitory computer-readable medium, storing computer-executable instructions executed on a computer system for performing a method for performing multiple tests on a device under test (DUT), wherein the method comprises:
- inputting a plurality of test patterns in a test apparatus, wherein each of the plurality of test patterns has at least two signals input into the test apparatus, wherein each of the signals has an attribute selected from a group consisting of voltage, current, data rate, and temperature;
- storing each of the plurality of test patterns in a respective register, wherein each of the registers stores two or more signals of each of the plurality of test patterns;
- automatically performing the plurality of test patterns stored in the registers on the DUT without interruption, wherein the test patterns stored in the registers are performed on the DUT independently with each other;
- obtaining a respective result for the DUT in response to the signals of each of the plurality of test patterns stored in the respective register, such that the results are obtained correspondingly in order to determine whether the DUT is operable or not;
- generating a Shmoo plot based on all the respective results to obtain a virtual edge; and
- determine operating regions of the DUT after the virtual edge is obtained.

9. The non-transitory computer-readable medium of claim 8, wherein the respective result is a visual representation, wherein the first signal of the first test pattern stored in the first register has a value identical to the first signal of the second test pattern store in the second register, while the second signal of the first test pattern stored in the first register has a value different from the second signal of the second test pattern store in the second register.

10. The non-transitory computer-readable medium of claim 8, wherein the signals of each of the plurality of test patterns have the same attribute, wherein the first signal of the first test pattern stored in the first register has a value different from the first signal of the second test pattern store in the second register, while the second signal of the first test pattern stored in the first register has a value different from the second signal of the second test pattern store in the second register.

11. The non-transitory computer-readable medium of claim 8, wherein the Shmoo plot is a 2-dimensional plot, wherein the virtual edge is in a non-linear direction.

12. The non-transitory computer-readable medium of claim 8, wherein the test apparatus is an automatic test equipment (ATE).

13. The non-transitory computer-readable medium of claim 8, wherein the signals of each of the plurality of test patterns have different attributes, wherein the first signal of the first test pattern stored in the first register has a value different from the first signal of the second test pattern store in the second register, while the second signal of the first test pattern stored in the first register has a value different from the second signal of the second test pattern store in the second register.

14. The non-transitory computer-readable medium of claim 8, wherein the registers are connected to a terminal of a system, wherein the signals of the test patterns are input to the terminal in order to store the test patterns in the register.

* * * * *